(12) United States Patent
Adivarahan et al.

(10) Patent No.: US 8,680,551 B1
(45) Date of Patent: Mar. 25, 2014

(54) HIGH POWER ULTRAVIOLET LIGHT SOURCES AND METHOD OF FABRICATING THE SAME

(75) Inventors: Vinod Adivarahan, Columbia, SC (US); Qhalid Fareed, Columbia, SC (US); Asif Khan, Irmo, SC (US)

(73) Assignee: Nitek, Inc., Columbia, SC (US)

( * ) Notice: Subject to any disclaimer, the term of this patent is extended or adjusted under 35 U.S.C. 154(b) by 184 days.

(21) Appl. No.: 13/070,174

(22) Filed: Mar. 23, 2011

Related U.S. Application Data

(63) Continuation-in-part of application No. 12/445,945, filed as application No. PCT/US2007/081634 on Oct. 17, 2007, now Pat. No. 8,242,484.

(60) Provisional application No. 60/852,672, filed on Oct. 18, 2006, provisional application No. 61/282,725, filed on Mar. 23, 2010.

(51) Int. Cl.
*H01L 33/60* (2010.01)
(52) U.S. Cl.
USPC ........... 257/98; 257/13; 257/E23.001; 257/79

(58) Field of Classification Search
USPC ................... 257/79, 98, 13, E33.001
See application file for complete search history.

(56) References Cited

U.S. PATENT DOCUMENTS

| | | | |
|---|---|---|---|
| 6,303,405 B1 | 10/2001 | Yoshida et al. | |
| 6,429,128 B1 | 8/2002 | Besser et al. | |
| 6,906,352 B2 | 6/2005 | Edmond et al. | |
| 2003/0057421 A1 | 3/2003 | Chen | |
| 2004/0224484 A1 | 11/2004 | Fareed et al. | |
| 2005/0042743 A1 | 2/2005 | Kawai et al. | |
| 2006/0169993 A1 | 8/2006 | Fan et al. | |
| 2011/0140078 A1* | 6/2011 | Hsu ................................ 257/13 |

* cited by examiner

*Primary Examiner* — Long Pham
(74) *Attorney, Agent, or Firm* — Michael A. Mann; Nexsen Pruet, LLC (57) ABSTRACT

A vertically conducting LED comprising, in a layered arrangement: a highly thermally conductive submount wherein the highly conductive submount has a thermal conductivity of at least 100 W/m°K; a p-type layer comprising $Al_{1-x-y}In_yGa_x N$ wherein $0 \leq x \leq 1$ and $0 \leq y \leq 1$; a quantum well layer comprising $Al_{1-x-y}In_yGa_xN$ wherein $0 \leq x \leq 1$ and $0 \leq y \leq 1$; an n-type layer comprising $Al_{1-x-y}In_yGa_xN$ wherein $0 \leq x \leq 1$ and $0 \leq y \leq 1$; and an n-type contact layer wherein the LED has a peak emission at 200-365 nm.

42 Claims, 10 Drawing Sheets

HIGH POWER ULTRAVIOLET LIGHT SOURCES AND METHOD OF FABRICATING THE SAME

CROSS-REFERENCE TO RELATED APPLICATIONS

The present application is a continuation-in-part of U.S. patent Ser. No. 12/445,945 filed Apr. 17, 2009 now U.S. Pat. No. 8,242,484 which is a U.S. National filing under 35 U.S.C. §371 of PCT/US07/81634 filed Oct. 17, 2007 which, in turn, claims priority to U.S. Provisional Patent Application No. 60/852,672 filed Oct. 18, 2006 all of which are incorporated herein by reference. The present application also claims priority to U.S. Provisional Patent Appl. No. 61/282,725 filed Mar. 23, 2010 which is incorporated herein by reference.

BACKGROUND

The present invention is related to an improved high power ultraviolet light source and a method of manufacturing the light source. More particularly, the present invention is related to a Group III nitride based light emitting diode which has improved efficiency and decreased joule heating.

Due to their wide and direct band gaps, group-III nitrides are promising semiconductor materials for a wide range of technological applications in optoelectronics, as well as high power-, high frequency- and high temperature electronic devices.

Recently, deep ultra-violet light emitting diodes, with peak emission wavelengths of 200-365 nm, have become a source of extensive research and development and significant commercialization efforts are underway. These deep UV LED's are being considered in such diverse areas as bio-medical research, water purification, air purification, bio-detection, solid state lighting and many others as described in Gil (Ed.) Group III Nitride Semiconductor Compounds, Physics and Applications; Series on Semiconductor Science and Technology, vol. 6, Oxford Science Publications, Oxford, 1998. Full commercial exploitation of deep UV LED's has been thwarted by extreme device self heating or joule heating. The propensity for joule heating in such devices stems from the fact that the epilayers needed for proper wavelength of emission requires very high aluminum content. With increasing aluminum content the doping efficiency decreases significantly which increases the resistance of the epilayer. The highly resistive epilayer causes a phenomenon commonly known as current crowding wherein the current injection occurs primarily near the n-contact perimeter close to the mesa side walls as detailed in Jpn. J. Appl. Phys. 41 (2002) pp. 5083-5087.

By way of example, group III-nitride based visible LED's and group III-nitride based UV LED's can be compared. The sheet resistance of n-GaN is 10 ohms/sq compared to 250 ohms/sq for 60% n-AlGaN. Thus, in deep UV LEDs with n-AlGaN the device differential resistance is very high which causes the optical power to have premature saturation and heating. In addition to the optical inefficiencies the heating degrades the device reliability and shortens product lifetimes.

There has been an ongoing desire for a deep UV LED which does not suffer illumination inefficiencies or heat related issues.

SUMMARY

It is an object of the invention to provide an improved deep UV LED.

A particular feature of the invention is to provide a deep UV LED with improved electrical conduction and improved thermal dissipation.

These and other advantages, as will be realized, are provided in a vertically conducting LED comprising, in a layered arrangement: a highly thermally conductive submount wherein the highly conductive submount has a thermal conductivity of at least 100 W/m°K; a p-type layer comprising $Al_{1-x-y}In_yGa_xN$ wherein $0 \leq x \leq 1$ and $0 \leq y \leq 1$; a quantum well layer comprising $Al_{1-x-y}In_yGa_xN$ wherein $0 \leq x \leq 1$ and $0 \leq y \leq 1$; an n-type layer comprising $Al_{1-x-y}In_y Ga_xN$ wherein $0 \leq x 1$ and $0 \leq y \leq 1$; and an n-type contact layer wherein the LED has a peak emission at 200-365 nm.

Yet another embodiment is provided in a method for forming an LED comprising:
providing a growth substrate;
forming at least one epilayer on the substrate;
forming in order:
an n-type layer comprising $Al_{1-x-y}In_yGa_xN$ wherein $0 \leq x \leq 1$ and $0 \leq y \leq 1$;
a quantum well layer comprising $Al_{1-x-y}In_yGa_xN$ wherein $0 \leq x \leq 1$ and $0 \leq y \leq 1$; and
a p-type layer comprising $Al_{1-x-y}In_yGa_xN$ wherein $0 \leq x \leq 1$ and $0 \leq y \leq 1$;
attaching a first sacrificial submount opposite the growth substrate;
removing the growth substrate;
removing the epilayer;
forming an n-type contact layer on the n-type layer;
attaching a second sacrificial substrate opposite the first sacrificial substrate;
removing said first sacrificial substrated; and
attaching a highly thermally conductive submount opposite the second sacrificial substrate wherein the highly thermally conductive submount has a thermal conductivity of at least 100 W/m°K. It is preferable to remove the second sacrificial substrate and to surface texture through etching, laser micro-machining or any other means on the exposed n-type epilayer for enhanced light extraction.

Yet another embodiment is provided in an LED comprising, in a layered arrangement: a highly thermally conductive submount wherein the highly conductive submount has a thermal conductivity of at least 100 W/m°K; a p-type layer comprising $Al_{1-x-y}In_yGa_xN$ wherein $0 \leq x \leq 1$ and $0 \leq y \leq 1$; a quantum well layer comprising $Al_{1-x-y}In_yGa_xN$ wherein $0 \leq x \leq 1$ and $0 \leq y \leq 1$; an n-type layer comprising $Al_{1-x-y}In_yGa_xN$ wherein $0 \leq x \leq 1$ and $0 \leq y \leq 1$; and an n-type contact layer; and wherein the LED has a peak emission at 200-365 nm.

DESCRIPTION

The instant invention is directed to an improved deep ultraviolet LED with emissions of 200-365 nm which has increased illumination efficiencies and lower heat generation. More specifically, the present invention is directed to a Group III nitride based LED with improved thermal dissipation due to vertical electrical conduction. Vertically conducting deep UV LED's force the current to pass in a vertical direction rather than in lateral directions as is the case for standard UV LED's.

It is well known to those skilled in the art that an active LED comprises semiconducting materials doped with impurities to form a p-n junction. Current flows from the p-side, or anode, to the cathode, or n-side, but not in the reverse direction. The wavelength of radiation is dependent on the band gap energy of the materials forming the p-n junction. Though not limited thereto, the present invention is particularly well suited for use in nitride-based light emitting devices such as Group III-nitride based devices. "Group III nitride" refers to those semiconducting compounds formed between elements in Group III of the periodic table and nitrogen. More preferably the Group III element is selected from the group consisting of boron (B), aluminum (Al), gallium (Ga), and/or indium (In). Ternary and quaternary compounds such as AlGaN and AlInGaN are particularly preferred. As is well understood in the art, the Group III elements can combine with nitrogen to form binary compounds such as GaN, AlN and InN; ternary compounds such as AlGaN, AlInN, and GaInN; and quaternary compounds, specifically AlInGaN. In each case the empirical formula is GN wherein G represents a Group III element or mixture of elements wherein one mole of nitrogen is combined with a total of one mole of the Group III elements. The semiconductor material is not particularly limited herein yet the advantages of the present invention are most readily appreciated in an LED based on Group III nitrides with the most preferable compound being $Al_xIn_yGa_{1-x-y}N$ wherein $0 \le x \le 1$, $0 \le y \le 1$, $0 \le x+y \le 1$ optionally doped with a material to form a n-type or p-type semiconductor. Boron can be incorporated in any layer comprising a group III nitride wherein the formulation is $Al_xIn_yB_zGa_{1-x-y}N$ wherein $0 \le x \le 1$, $0 \le y \le 1$, $0 \le z \le 10 \le x+y+z \le 1$ Between the n-type and p-type is a quantum well and most preferably a multilayered quantum well which may or may not be doped.

The invention will be described with reference to the various figures which are an integral non-limiting component of the specification. Throughout the specification similar elements will be numbered accordingly.

Figure 10:
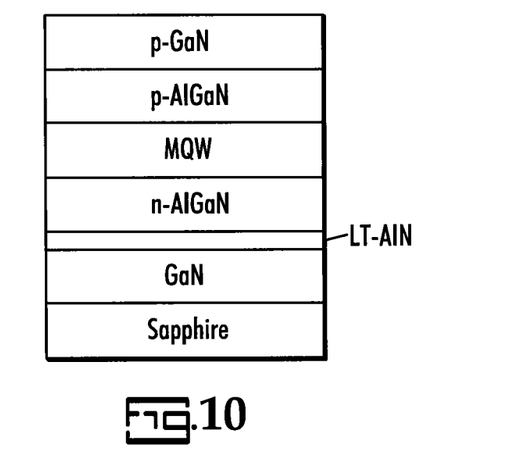
FIG. 10 shows a schematic that is representative of prior art for vertical geometry devices with GaN buffer layer.

FIG. 10 illustrates prior art as set forth in "Vertical Injection Thin-Film AlGaN/AlGaN Multiple-Quantum-Well Deep Ultraviolet Light-Emitting Diodes", Zhou et al., *Applied Physics Letters* 89, 241113 2006. A vertically injected thin-film structure is a particularly attractive device design for high power LEDs. It can be inferred from FIG. 10 that the GaN epilayer was used as a sacrificial buffer layer for the laser lift-off process. Referring to FIG. 10, the gallium nitride epilayer was deposited over a sapphire substrate using a conventional metal organic chemical vapor deposition (MOCVD) technique. This layer was used as a sacrificial layer wherein the laser radiation was absorbed and hence the sapphire substrate was removed. This GaN layer also helped in allowing insertion of a metamorphic AlN layer to grow the complete UV LED structure.

Although the insertion of GaN buffer helps in substrate removal, it does bring in the disadvantages of increased dislocation between GaN and AlN interface thereby reducing the efficiency of devices, particularly, deep UV LED's. It is preferred, but not limited, to aid in substrate removal with AlN buffer, and the teachings can easily be applied to any optoelectronic structure especially with group III nitrides.

A vertically conducting deep UV LED mitigates the problems associated with current crowding. Current crowding is prevalent in lateral conduction devices, particularly, when high aluminum content is employed. Vertical conduction deep UV LED's are particularly suitable for systems with high input drive current and it is preferable to further enhance the performance of vertically conducting deep UV LEDs. The present invention allows for the use of highly thermally conducting submounts and an improved efficiency with regards to thermal transfer to the highly thermally conducting submount.

The lattice mismatches between available high thermal conductive submounts and group III nitrides is such that growth directly on the high thermal conductive submounts has proven illusive. The present invention provides a method for manufacturing deep UV LED's which avoids the problems associated with growth of group III nitrides over a substrate with incompatible lattice parameters.

Figure 1:
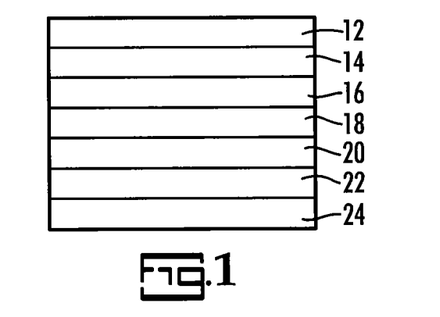
FIG. 1 is a schematic side view of a layered arrangement.

The process for forming the vertical LED will be described with reference to FIGS. 1-7 wherein schematic cross-sectional views of the embodiment are illustrated at various steps of the process of manufacturing the vertically conductive LED's. In FIG. 1, a layered structure is provided comprising a first substrate, 24. The substrate is not particularly limiting with sapphire, silicon, silicon carbide, GaN, AlN, AlGaN, InN, InGaN, AlInGaN, GaAs, $LiAlO_3$, $LiGaO_3$, ZnO, diamond or diamond like materials or a metal being mentioned as suitable for demonstration of the teachings herein. Sapphire is most preferred due to availability, widespread use and extensive teachings related to the manufacture of deep UV LED's with associated buffer layers wherein defect propagation to the active layers is minimized. Preferred substrates are c-plane substrates selected from the group consisting of aluminum nitride, gallium nitride, aluminum gallium nitride, aluminum indium gallium nitride, aluminum indium nitride, SiC, sapphire and lithium aluminate. Even more preferred are an m-plane, a-plane or r-plane of a aluminum nitride, gallium nitride, aluminum gallium nitride, aluminum indium gallium nitride, aluminum indium nitride, SiC, sapphire or lithium aluminate substrate.

A buffer layer, 22, is applied to a growth substrate. The buffer layer comprises at least one layer of $Al_xIn_yGa_{1-x-y}N$ wherein $0<x<1$, $0<y<1$ and $0<x+y<1$. Though not limited thereto, AlN, wherein x=1 and y=0 is a preferred buffer layer. In one preferred embodiment, the buffer layer is used as a sacrificial layer for laser liftoff. The buffer layer is preferably deposited via pulsed atomic layer epitaxial (PALE) growth, and most preferably it is an aluminum nitride layer, although this is not necessary for the present invention. The PALE growth technique greatly improves the quality of the layer by enhancing a two dimensional step-growth mode.

A short period superlattice (SPSL) layer, 20, is applied to the buffer layer. The SPSL layer comprises AlInGaN/AlInGaN and is a transition between the composition of the buffer layer and the composition of the subsequent layer. It is preferred that the gallium to aluminum ratio generally increases through the layer and the increase in gallium is approximately sinusoidal and increasing through the layer.

The buffer and SPSL layers are intended to form a substrate with lattice parameters which are compatible with subsequent active layers. By closely matching the lattice parameters of the substrate and active layers defect propagation is minimized. Furthermore, pulsed deposition techniques allow any defect propagated in the substrate layers to be terminated within the substrate and therefore not transmitted to the active layers.

Active layers are applied to the buffer layers. The active layers comprise layers of opposing polarity with a quantum well layer there between.

An n+AlInGaN clad layer, 18, is applied to the SPSL layer. The n+AlInGaN clad layer is preferably silicon doped. In one embodiment the clad layer is co-doped with In. The n+ AlInGaN layer has a preferred composition of $Al_{1-x}In_yGa_xN$ wherein $0 \le x \le 1$ and $0 \le y \le 1$ and the n+ AlInGaN layer may also contain boron as a group III component. The layer thickness of the n+ AlInGaN layer is preferably at least 10 Å to no more than 20 µm and more preferably 50 Å to no more than 5 µm. It is preferable that the n+ AlGaN clad layer has a bandgap energy such that it is transparent to the wavelength of light emitted by the light emitting region.

A multilayered quantum well layer, 16, is applied to the n+ AlInGaN layer. The multilayered quantum well layer has a composition of $Al_{1-x}In_yGa_xN$ wherein $0 \le x \le 1$ and $0 \le y \le 1$ and the layer may contain boron as a group III component. The multilayered quantum well layer, 16, is followed by the light emitting region which contains either a single quantum well or multiple quantum wells. The quantum well active region, 16, preferably comprises barrier layers and quantum wells in alternating arrangement. In a particular embodiment, the quantum well active region 16 preferably includes from 1 to 12 quantum wells without limit thereto. The thickness and composition of the well and barrier layers may be selected so as to provide emission at a desired output wavelength in the ultra-violet region of the electromagnetic spectrum. Furthermore, changes in composition of the well layer may be offset by changes in the thickness of the well layer. For example, to provide an output wavelength of 340 nm, a GaN well layer having a thickness of about 15 Å may be utilized, whereas to provide an output wavelength of 320 nm, an AlGaN well layer may be utilized. Thus, to select the characteristics of the quantum well and barrier layers, the thickness and composition of the barrier and well layers may be selected so as to provide optimized performance. This may include balancing sufficient composition to provide carrier confinement for the emission wavelength while maintaining performance. This may also include optimizing thickness to provide sufficient carrier confinement while minimizing stress (strain) in the film, which in turn minimizes cracking in the epitaxial layers. Particular structures of the quantum well active region, 16, are described in further detail below. The barrier layer preferably comprises $Al_xInyGa_{1-x-y}N$ wherein $0 \le x \le 1$, $0 \le y \le 1$, $0 \le x+y \le 1$ and may contain boron.

The quantum well level comprises quantum well structures including a barrier layer and a well layer potentially with multiple repetitions of each. The well layer or layers are preferably contained between two opposing barrier layers. Thus, for m well layers, m or m+1 barrier layers are preferably provided depending on whether the last layer is a barrier layer. Furthermore, a barrier layer may be provided as one or more layers as described, for example, in United States Patent Publication No. 2003/0006418 entitled GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES, or United States Patent Publication No. 2006/0267043 entitled DEEP ULTRAVIOLET LIGHT EMITTING DEVICES AND METHODS OF FABRICATING DEEP ULTRAVIOLET LIGHT EMITTING DEVICES, both disclosure of which are incorporated herein as if set forth in its entirety. The barrier layers and the well layers may be fabricated using conventional Group III nitride growth techniques such as those discussed above. In particular embodiments of the present invention, the barrier layer has a preferable thickness of from about 5 Å to no more than about 300 Å and the well layer has a preferable thickness of from about 5 Å to about 300 Å. The quantum well and barrier layers may be formed by pulse techniques as described further herein.

The composition of the barrier and well layers of the quantum well is selected based on the preferred emission. For example, to provide an output wavelength of 340 nm, a GaN well layer having a thickness of about 15 Å may be utilized, whereas to provide an output wavelength of 320 nm, an AlGaN well layer may be utilized. Thus, to select the characteristics of the quantum well and barrier layers, the thickness and composition of the barrier and well layers may be selected so as to provide optimized performance. This may include balancing sufficient composition to provide carrier confinement for the emission wavelength while maintaining performance. This may also include optimizing thickness to provide sufficient carrier confinement while minimizing stress (strain) in the film, which in turn minimizes cracking in the epitaxial layers.

A p-AlInGaN layer, 14, is applied to the multilayered quantum well. The p-AlInGaN layer preferably has a composition of $Al_{1-x-y}In_yGa_xN$ wherein $0 \le x \le 1$ and $0 \le y \le 1$. The quantum well may contain boron as a group III element. The p-AlInGaN layer may be doped with magnesium, zinc, beryllium, or combinations thereof. The bandgap energy of the doped layer is greater than or equal to the bandgap of the layer adjacent to it such that it provides an energy barrier for carrier flow. The p-AlInGaN layer preferably has a thickness of from about 10 Å to about 1 µm and more preferably from about 50 Å to about 0.5 µm.

A $p-Ga_{1-n}N$ or p-GaN contact layer, 12, is applied to the p-AlInGaN layer. The contact layer may be doped with a p-type dopant, such as Mg, Zn, Be, or any combination thereof and may have a thickness of from about 10 Å to about 1.0 µm and more preferably 50 Å to about 0.5 µm. The contact layer may be fabricated using conventional Group III nitride growth techniques such as those discussed herein.

Figure 2:
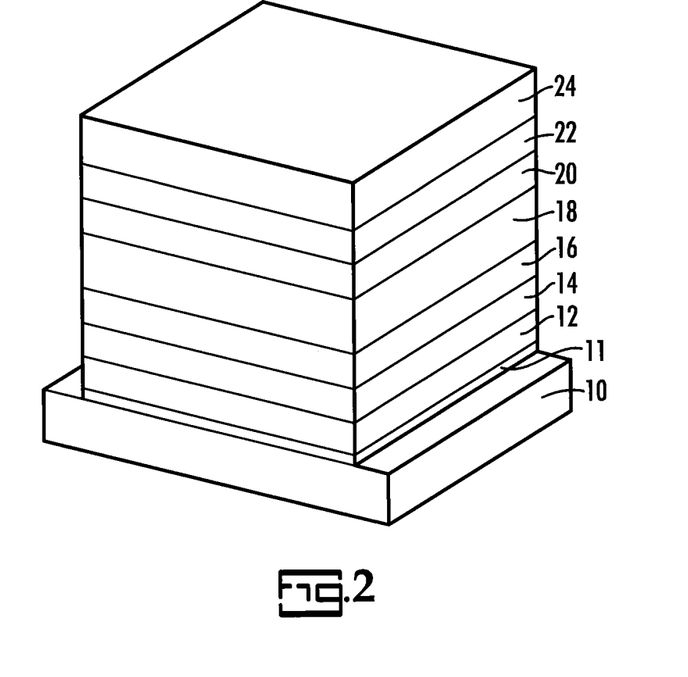
FIG. 2 is a schematic perspective view of a layered arrangement.
Figure 3:
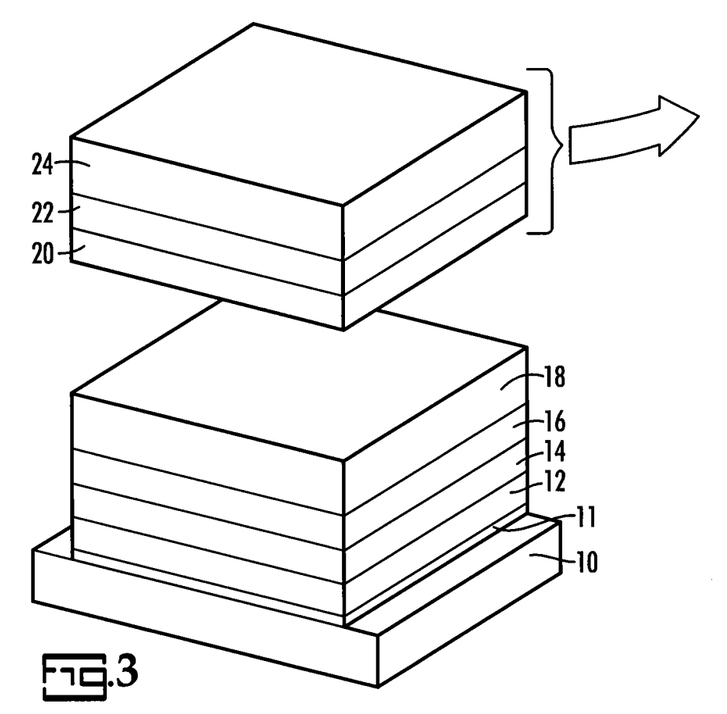
FIG. 3 is a schematic perspective exploded view of a layered arrangement.

With reference to FIG. 2, the p-$Ga_{1-n}N$ layer is attached to a first sacrificial submount, 10, preferably by a bonding glue, 11, with the growth substrate opposite to the first sacrificial substrate. The growth substrate, 24, buffer layer, 22 and short period superlattice (SPSL) layer, 20, are then removed as illustrated schematically in FIG. 3 thereby exposing the n+ AlInGaN layer. The growth substrate is de-laminated or removed such as by a laser lift-off technique. The buffer layer and SPSL layer are removed by etching, polishing, grinding or any such means.

Figure 4:
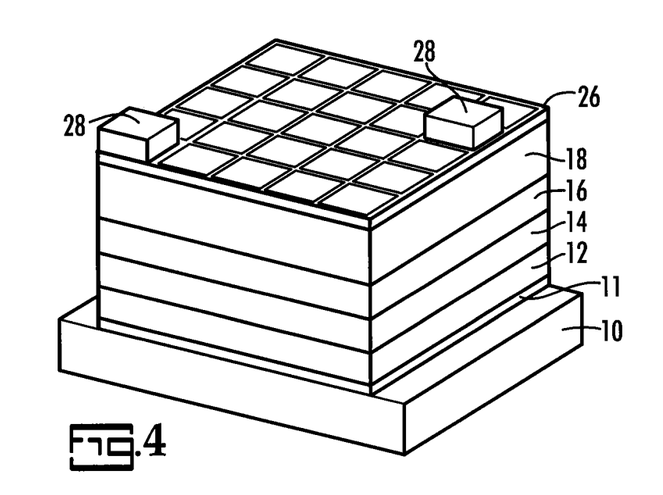
FIG. 4 is a schematic perspective view of a layered arrangement.

With reference to FIG. 4, a back side n-type contact layer, 26, and n-contacts, 28, are deposited and, if necessary, annealed. Deposition of the n-type contact layer and n-contacts may either be followed by, or preceded by, surface texturing of n-type AlInGaN for enhanced light extraction.

Figure 5:
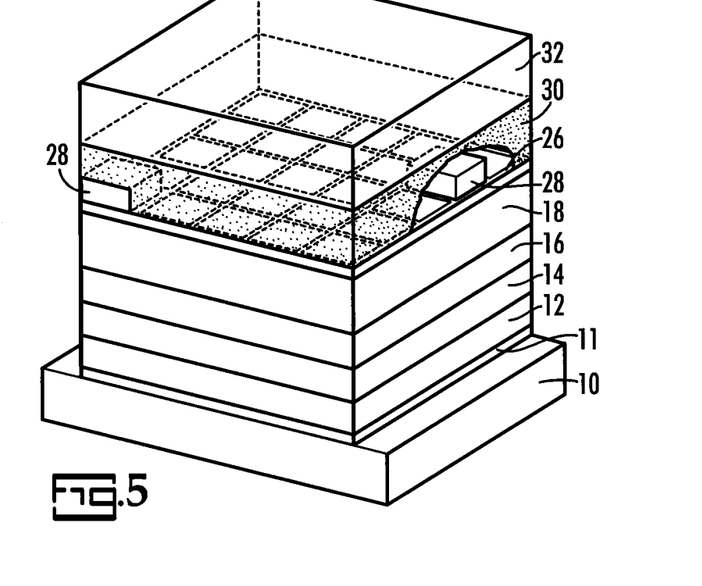
FIG. 5 is a schematic perspective, partial-cutaway, view of a layered arrangement.

With reference to FIG. 5, a second superficial submount, 32, is attached to the n-type contact layer, 26, by a bonding glue, 30. The n-contacts, 28, may be encased in bonding glue, 30.

Figure 6:
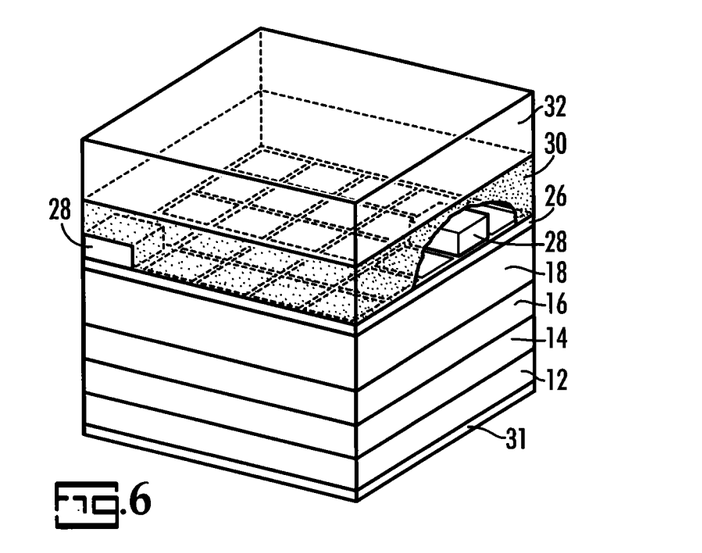
FIG. 6 is a schematic perspective, partial-cutaway, view of a layered arrangement.
Figure 7:
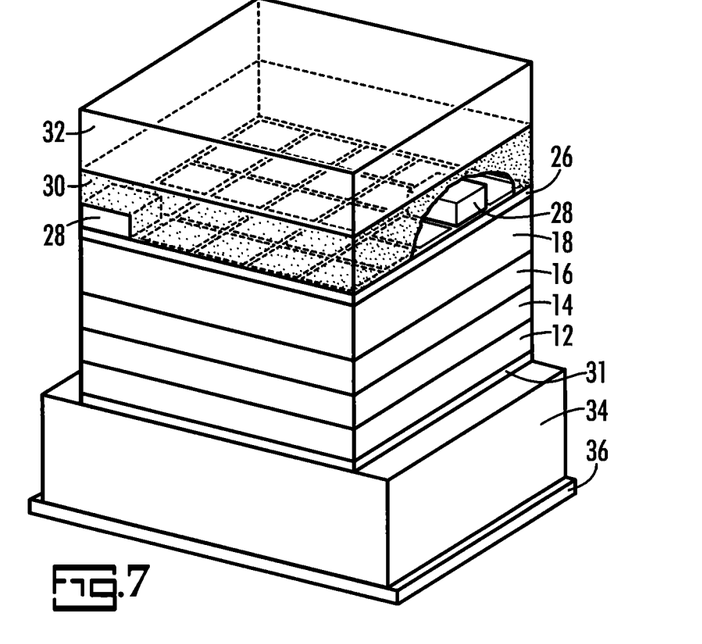
FIG. 7 is a schematic perspective, partial-cutaway, view of a layered arrangement.

The first sacrificial submount, 10, is removed and, with reference to FIG. 6, the p+$Ga_{1-n}N$ or P+GaN layer is preferably coated with ohmic contact metals such as Ni, Pd, Au, Pt or any combination of such metals and annealed, which is then electroplated further to increase thickness by plating gold thereby forming a stacked ohmic contact layer 31. A high thermal conductive submount, 34, is bonded to the ohmic contact layer thereby forming an electrical contact between the high thermally conductive submount and the p+$Ga_{1-n}N$ layer as illustrated in FIG. 7. The contacts are preferably platinum contacts with other conductive contacts, such as rhodium, zinc oxide, palladium, palladium oxide, titanium, nickel, gold, nickel/gold alloy, nickel oxide, nickel oxide/gold alloy, platinum, nickel oxide/platinum, indium tin oxide and/or titanium/gold alloy, tin and gold/tin alloy mentioned as suitable for demonstration of the teachings herein. The ohmic contact may be followed up by a stack of metal layers comprised of any combination of the above mentioned metal layers. In one embodiment, the ohmic contact has an average thickness ranging from 10 Å to 10 μm. The ohmic contact layer may be formed by electron beam (e-beam) evaporation or any other suitable technique for controllably forming atomically thin metallic films. For example, it may be possible to form the ohmic contacts by electroplating, or thermal evaporation provided adequate process control is maintained. In electron beam evaporation, a metal source target is heated in a vacuum chamber to the point of vaporization by a high intensity electron beam which melts a region of the target. An epitaxial wafer placed within the chamber is controllably coated with vaporized metal. E-beam evaporation and other film deposition methods are described in Chapter 6 of INTRODUCTION TO MICROELECTRONIC FABRICATION by R. Jaeger (2nd Ed. 2002).

Figure 8:
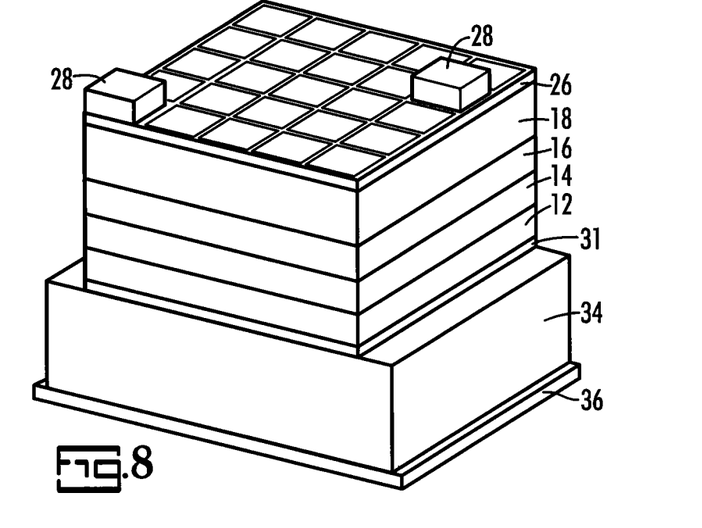
FIG. 8 is a schematic perspective view of a layered arrangement.

The second sacrificial submount, 32, and bonding glue, 30, are removed thereby providing the vertical deep UV LED as illustrated in FIG. 8 wherein the p-contact, 36, thereby allows vertical conduction through the active regions to a planar n-type contact layer, 26, thereby eliminating current (or charge) crowding. It is preferable to remove the second sacrificial substrate and to surface texture through etching, laser micro-machining or any other means on the exposed n-type epilayer for enhanced light extraction.

Figure 9:
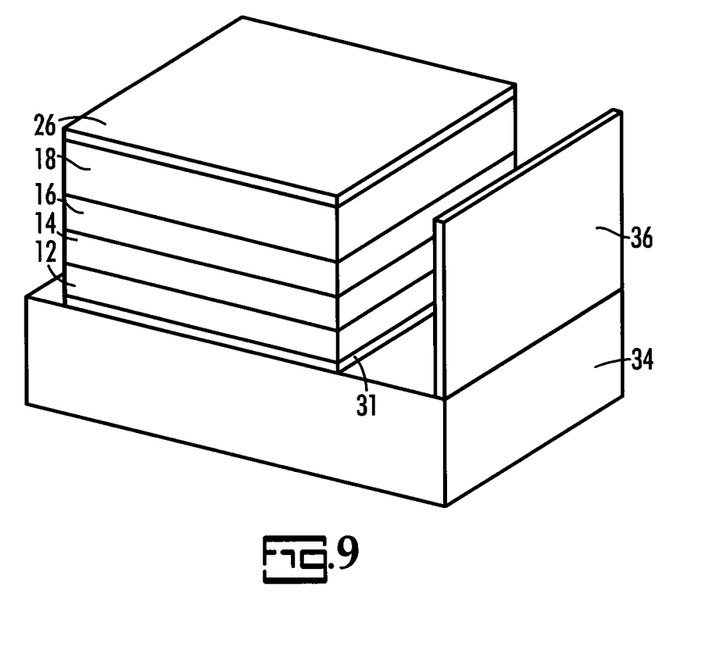
FIG. 9 is a schematic perspective view of a lateral geometry LED.

An embodiment of the invention is illustrated in schematic perspective view in FIG. 9. In FIG. 9, the LED is in a lateral geometry wherein the p-contact, 36, and n-type contact layer, 26, are coplanar thereby allowing mounting on a common face. The advantages provided by the instant invention are thereby provided in a lateral geometry.

The devices are preferably formed on a large scale and then singulated for further dicing and packaging as would be realized to one of skill in the art.

The highly thermally conductive submount has a thermal conductivity of at least 100 W/m°K. More preferably, the highly thermal conductive submount has a thermal conductivity of at least 500 W/m°K with 800 W/m°K being more preferred and 1000 W/m°K being even more preferred. Chemical vapor deposited diamond or, any diamond like coating (DLC), is preferably employed as the highly thermally conductive submount since these materials have a thermal conductivity of about 1200-1400 W/m°K. Boron nitride, particularly vapor deposited boron nitride, is also suitable for demonstration of the invention since boron nitride has a thermal conductivity of about 1700-2000 W/m°K. By using such high thermally conductive submounts the ability to dissipate heat increases dramatically such as by a factor of 3 or 4 compared to conventional submounts. Submount thicknesses between 50-1000 μm are particularly suitable for demonstration of the teachings. The combination of vertical conduction and high thermal conductive substrates greatly mitigates the impact of joule heating when high aluminum compositions are employed in deep UV LED's. Copper-tungsten, copper-molybdenum, copper and it's alloys and ceramic-metallic alloys are mentioned as suitable submounts.

Figure 11:
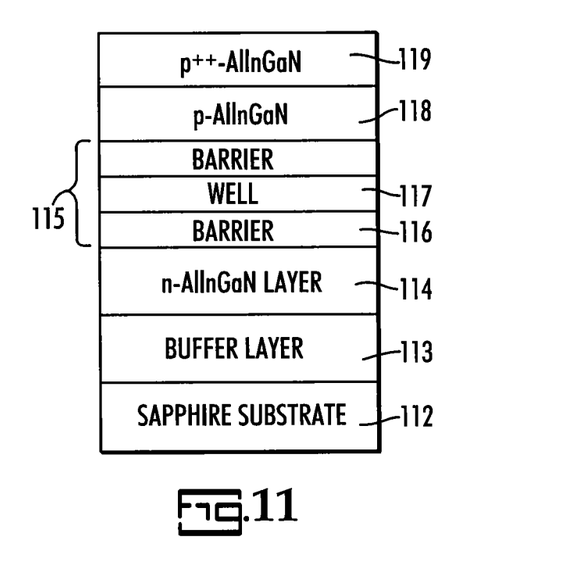
FIG. 11 schematically illustrates a light emitting device structure.

With reference to FIG. 11. The vertical LED device structure comprises a substrate, 112, a buffer layer, 113, first doped layer, 114, which is preferably n-doped, a single quantum well or multiple quantum well light emitting region, 115, comprising barrier layers, 116, and well layers, 117, a second doped layer, 118, which is preferably p-doped, and a contact layer, 119.

The substrate, 112, serves as a sacrificial base upon which epitaxial layers are formed. The substrate is subsequently removed or separated from the epitaxial layers during the process of forming the LED. As a result it is undesirable to use expensive substrate materials even though the number of inexpensive substrate materials which are suitable for Group III nitride based LEDs is limited due to the propensity for defect propagation when a Group III nitride is applied to a material with mismatched lattice parameters. A method for limiting defect propagation as described herein allows the use of less expensive substrates, such as sapphire, which is preferred due to the low cost and availability relative to other substrates. Other substrates such as silicon carbide, silicon, gallium nitride, aluminum nitride, gallium arsenide, $Al_xIn_yGa_{1-x-y}N$ wherein $0<x<1$, $0<y<1$ and $0<x+y<1$ and/or other microelectronic substrates, can be used but sapphire is most preferred. The substrate may be polar, semi-polar or non-polar and it may be patterned or non-patterned. The substrate may be porous and the porosity may be done in-situ or ex-situ. Particularly preferred are non c-plane substrates selected from the group consisting of aluminum nitride, gallium nitride, aluminum gallium nitride, aluminum indium gallium nitride, aluminum indium nitride, SiC, sapphire and lithium aluminate. Even more preferred are an m-plane, a-plane or r-plane of a aluminum nitride, gallium nitride, aluminum gallium nitride, aluminum indium gallium nitride, aluminum indium nitride, SiC, sapphire or lithium aluminate substrate.

The buffer layer, 113, comprises at least one layer of $Al_xIn_yGa_{1-x-y}N$ wherein $0<x<1$, $0<y<1$ and $0<x+y<1$. In one preferred embodiment, the $Al_xIn_yGa_{1-x-y}N$ layer that is used as the sacrificial layer for laser liftoff, also referred to as a lift-off layer, is deposited via pulsed atomic layer epitaxial (PALE) growth, and most preferably it is an aluminum nitride layer, although this is not necessary for the present invention. The PALE growth technique greatly improves the quality of the layer by enhancing a two dimensional step-growth mode.

In one embodiment, the buffer layer 113 includes at least one strain layer superlattice consisting of alternating layers of $Al_xIn_yGa_{1-x-y}N/Al_rIn_sGa_{1-r-s}N$ such that $0<x\le1$, $0\le y\le1$, $0<x+y\le1$, $0<r\le1$, $0\le s\le1$, and $0<r+s\le1$ and the bandgap of the two materials are not the same. In one embodiment the materials are deposited via PALE deposition, although this is not necessary for the present invention. The superlattice layers function as dislocation filters wherein defect bending results in a decrease in the magnitude of defects that extend to the subsequent light emitting region.

Referring again to FIG. 11, a doped semiconductor layer, 114, is applied to the buffer region, 113. The doped semiconductor layer, 114, is preferably an n-type semiconductor, more preferably a Group III nitride layer doped with n-type dopants, such as silicon, indium, oxygen, carbon, or simultaneous doping of combinations of the previously mentioned species. Layer 114 shall have a bandgap energy such that it is transparent to the wavelength of light emitted by the light emitting region. The doped semiconductor may be a p-type semiconductor if the doped layer opposite the light emitting region is a n-type semiconductor.

The Group III nitride layer, 114, is followed by the light emitting region, 115, which contains either a single quantum well or multiple quantum wells. The quantum well active region, 115, comprises barrier layers, 116, and quantum wells, 117. In a particular embodiment, the quantum well active region, 115, preferably includes from 1 to 12 quantum wells, 117, without limit thereto. The thickness and composition of the well and barrier layers may be selected so as to provide emission at a desired output wavelength in the ultraviolet region of the electromagnetic spectrum. Furthermore, changes in composition of the well layer may be offset by changes in the thickness of the well layer. For example, to provide an output wavelength of 340 nm, a GaN well layer having a thickness of about 15 Å may be utilized, whereas to provide an output wavelength of 320 nm, an AlGaN well layer may be utilized. Thus, to select the characteristics of the quantum well and barrier layers, the thickness and composition of the barrier and well layers may be selected so as to provide optimized performance. This may include balancing sufficient composition to provide carrier confinement for the emission wavelength while maintaining performance. This may also include optimizing thickness to provide sufficient carrier confinement while minimizing stress (strain) in the film, which in turn minimizes cracking in the epitaxial layers. Particular structures of the quantum well active region, 115, are described in further detail below. The barrier layer preferably comprises $Al_xIn_yGa_{1-x-y}N$ wherein, $0\le c\le1$, $0\le y\le1$, $0\le x+y\le1$.

Returning to FIG. 11, a doped layer, 118, preferably doped with p-type dopants is provided on the multiple quantum well active region, 115. In particular embodiments of the present invention, the doped layer, 118, may be doped with magnesium, zinc, beryllium, or combinations of the aforementioned species. The bandgap energy of the doped layer, 118, is greater than or equal to the bandgap of the layer adjacent to it from 115 such that it provides an energy barrier for carrier flow, referred to as an electron blocking layer by those skilled in the art. The doped layer, 118, preferably has a thickness of from about 50 Å to about 0.5 µm.

The quantum well active region, 115, comprises quantum well structures including a barrier layer, 116, and a well layer, 117, potentially with multiple repetitions of each. The well layer or layers, 117, are contained between two opposing barrier layers, 116. Thus, for m well layers, 117, m or m+1 barrier layers, 116, are provided depending on whether the last layer of 115 is a barrier layer. Furthermore, a barrier layer, 116, may be provided as one or more layers as described, for example, in U.S. Patent Publication No. 2003/0006418 entitled GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES, or United States Patent Publication No. 2006/0267043 entitled DEEP ULTRAVIOLET LIGHT EMITTING DEVICES AND METHODS OF FABRICATING DEEP ULTRAVIOLET LIGHT EMITTING DEVICES, both disclosure of which are incorporated herein as if set forth in its entirety. The barrier layers, 116, and the well layers, 117, may be fabricated using conventional Group III nitride growth techniques such as those discussed above. In particular embodiments of the present invention, the barrier layer, 116, has a preferable thickness of from about 5 Å to about 300 Å and the well layer, 117, has a preferable thickness of from about 5 Å to about 300 Å.

A contact layer, 119, may also be provided on the doped layer, 118. The contact layer, 119, may be a III-Nitride based layer and may have a lower percentage of Al than the doped layer, 118, or a higher doping concentration than the doped layer 118. The contact layer, 119, may be doped with a p-type dopant, such as Mg, Zn, Be, or any combination of the aforementioned species and may have a thickness of from about 10 Å to about 1.0 µm. The doped layer, 118, and the contact layer, 119, may be fabricated using conventional Group III nitride growth techniques such as those discussed herein.

The buffer layer 113 and other device epilayers (114, 115, 116, 117, 118 and 119) can be grown by metal organic chemical vapor deposition (MOCVD), pulsed metal organic chemical vapor deposition, metal organic hydride vapor phase epitaxy (MOHVPE), pulsed metal organic hydride vapor phase epitaxy, hydride vapor phase epitaxy (HVPE), molecular beam epitaxy (MBE), or any combination thereof.

The semiconductor layers (113-119) can be grown by pulsing the concentration of precursors such as trialkyl (ethyl or methyl but preferably methyl) aluminum or gallium, or ammonia. Pulsing of precursor concentration assists in atomic layer surface migration of materials which improves the material properties of the layer. This growth technique has been referred to in several forms in the prior art and also incorporated in this patent as a PALE growth technique.

Figure 12:
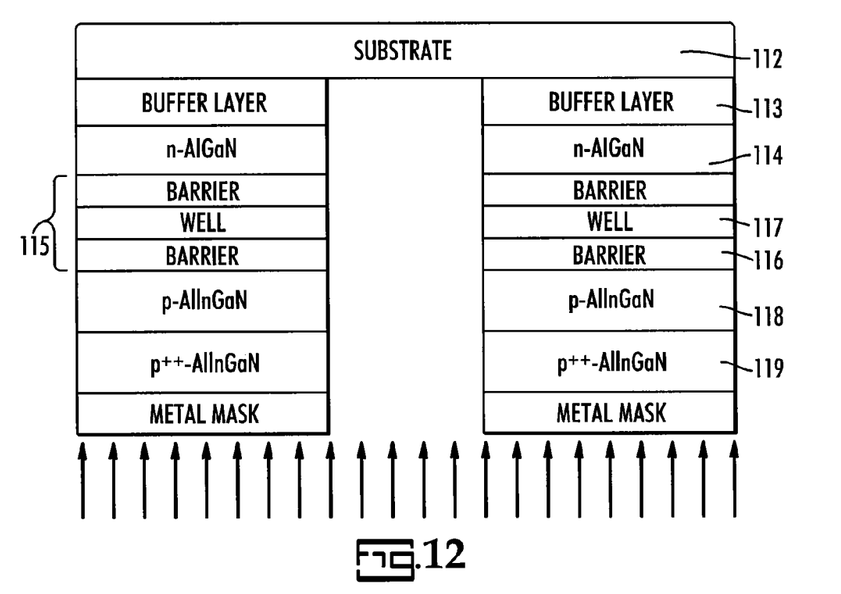
FIG. 12 indicates a process to create deep isolation trenches to avoid epilayer cracks.

Referring to FIG. 12, The device epilayers required for the realization of deep UV LED's are highly strained due to the high aluminum content. To avoid cracking of epilayers after laser assisted substrate lift-off it is preferable to form isolation trenches, 123, from the epilayer side. In a preferred embodiment, these trenches are formed using a metal mask, 124, comprising metals such as Ti, Ni and dielectrics such as silicon dioxide. The trenches are formed using standard photolithographic processes that are well known to those skilled in the art. The metal mask is removed after trench formation.

Figure 13:
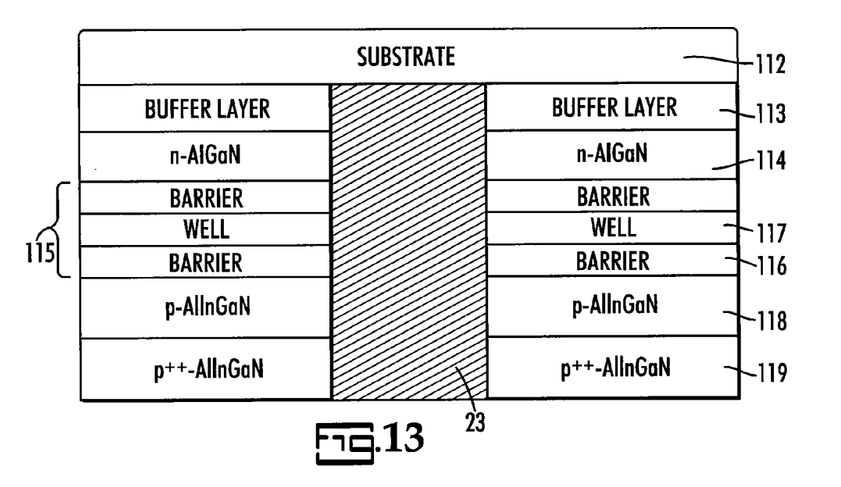
FIG. 13 shows a process of filling the isolation trenches with dielectric or soft polymers.

Referring to FIG. 13, the substrate comprising isolation trenches, 123, is filed with a soft polymer. The polymers are preferably selected from re-flow photo-resist SU-8, spin on glass (SOG) and benzo-cylco-butene (BCB). Re-flow photo-resist SU-8 is a commonly used negative photoresist available from various commercial sources. These polymers are preferred due to their ease of patterning by standard photolithography, viscosity, temperature stability and dielectric strength. The polymers should be able to withstand back-end processing conditions, such as a temperature from about 30° C. to about 800° C., bonding pressures, etc. They should also have a high dielectric strength, be electrically non-conductive and inert to UV radiation and chemicals.

Referring again to FIG. 13, in another embodiment the substrate comprises isolation trenches, 123, is filed with a dielectric, preferably selected from silicon dioxide and silicon nitride. These dielectrics are typically, but not limited to, deposition using plasma enhanced chemical vapor deposition (PECVD). In one embodiment the dielectric is formed by using ammonia, silane, di-silane, tetra-ethyl ortho silicate, oxygen, nitrous oxide and helium as precursor gases. The temperature preferably ranges from 70° C. to 300° C. Typical pressure ranges from 300 mTorr to 1000 mTorr are used. The radio frequency power (RF power) preferably ranges from 10 watts to 200 watts. Other techniques such as e-beam, sputtering may be employed to form the dielectric. The dielectrics can also be deposited by a novel dielectric deposition technique using PECVD systems as described in U.S. Published Patent Application No. 20100102359 published Apr. 29, 2010 and PCT/US07/87755 filed Dec. 17, 2007 both of which are incorporated herein by reference. The dielectric should be able to withstand back-end processing conditions, such as a temperature from about 30° C. to about 800° C., bonding pressure, etc. They should also have a high dielectric strength, be electrically non-conductive and inert to UV radiation and chemicals.

Figure 14:
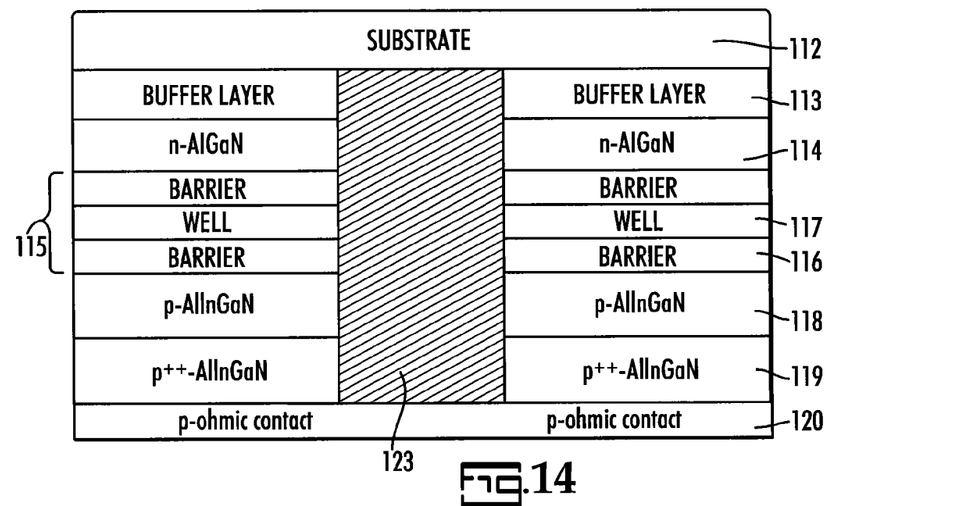
FIG. 14 depicts a schematic of the device with ohmic contacts to one type of material preferably p-type conductivity.

Referring to FIG. 14, an ohmic contact, 120, may be provided on the contact layer, 119. The contacts may be a platinum contact. Other materials may be used for the ohmic contact. For example, the ohmic contact may comprise rhodium, zinc oxide, palladium, palladium oxide, titanium, nickel, gold, nickel/gold alloy, nickel oxide, nickel oxide/gold, platinum, nickel oxide/platinum alloy, indium, tin oxide, titanium, titanium/gold alloy, tin and gold/tin alloy. The ohmic contact may be followed up by a stack of metal layers comprised of any combination of the above mentioned metal layers. In some embodiments, the ohmic contact has an average thickness ranging from 10 Å to 10 μm.

The ohmic contact may be formed by electron beam (e-beam) evaporation or any other suitable techniques for controllably forming atomically thin metallic films. For example, it may be possible to form the ohmic contacts by electroplating, or thermal evaporation provided adequate process control is maintained. In electron beam evaporation, a metal source target is heated in a vacuum chamber to the point of vaporization by a high intensity electron beam which melts a region of the target. An epitaxial wafer placed within the chamber is controllably coated with vaporized metal. E-beam evaporation and other film deposition methods are described in Chapter 6 of INTRODUCTION TO MICROELECTRONIC FABRICATION by R. Jaeger (2nd Ed. 2002).

Figure 15:
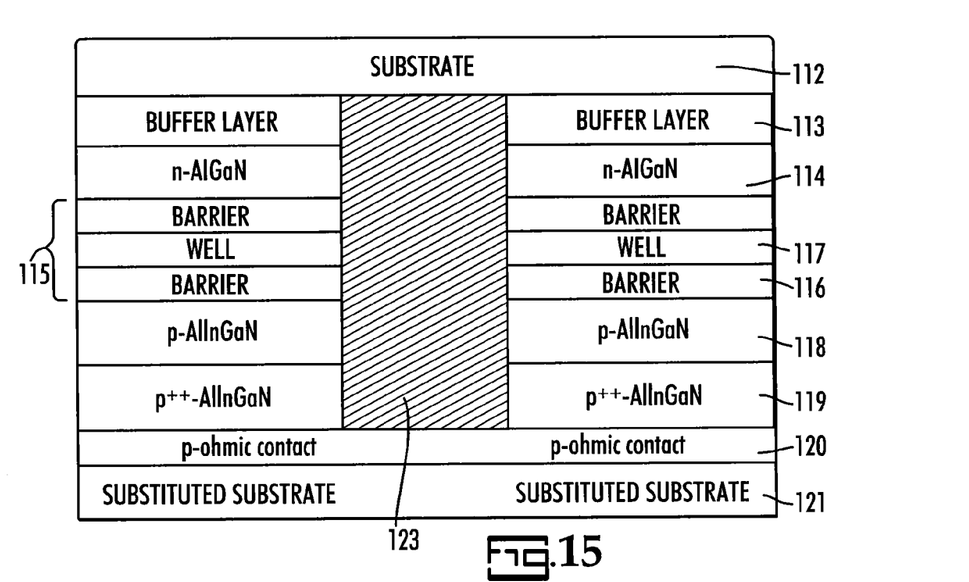
FIG. 15 depicts a schematic showing bonding of the device to the substitutional substrate.

The light emitting device may be mounted by a flip-chip technique. The devices, typically called "dies" in the art, are mounted with the active epilayer side facing the carrier, also referred to as a sub-mount (or as "substituted substrate 121" in FIG. 15), by various bonding techniques known in the art including but not limited to, bump-bonding, thermosonic bonding, eutectic bonding or epoxy bonding wherein a suitable material is deposited at specific places on both the die and carrier. Specific preferred bonding materials include, but are not limited to, mixtures, preferably eutectic mixtures of tin, gold, lead and indium; silver paint and the like. Bonding materials are preferably deposited by thermal evaporation for thickness control but can be deposited by other techniques such as by electroplating, sputtering, etc.

Referring again to FIG. 15, the contact on the substituted substrate may be any suitable material. Typically polycrystalline aluminum nitride, aluminum nitride, silicon, alloy of titanium-tungsten and copper, alloy of copper-tungsten, silicon-carbide are used a substituted substrate or carriers. Any suitable technique for forming a contact to the substrate 21 may be utilized. Such techniques are known to those of skill in the art and, therefore, need not be described further herein. The invention described herein is not limited to structures having crystalline epitaxial growth substrates as substituted substrates.

The carrier substrate, or submount, may have thermal, electrical, structural and/or optical characteristics which are better suited to the finished product than the native substrate.

Figure 16:
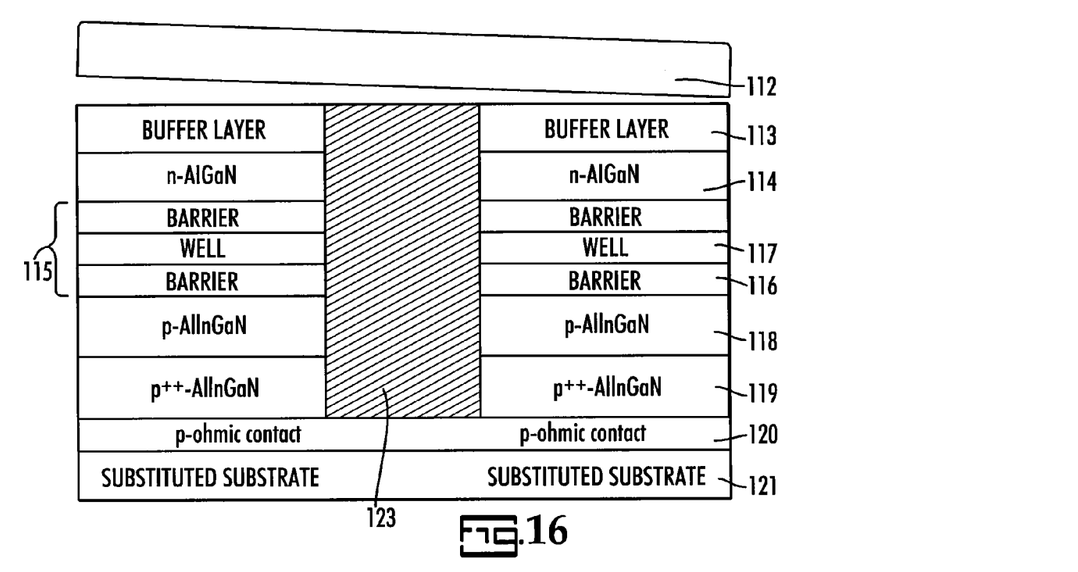
FIG. 16 a schematic of the device with the native substrate lifted-off.

Referring to FIG. 16, it is preferred to separate the sandwich comprising the n-type semiconductor, multiple quantum well and p-type semiconductor at the strain relieved buffer layer. The separation is typically accomplished by laser assisted lift-off using an appropriate wavelength of light.

For GaN the appropriate wavelength of laser for lift-off is about 248 nm whereas for $Al_xIn_yGa_{1-x-y}N$ where x>0 the appropriate wavelength of the laser is about 193 nm. It is preferable to use an AlN as a lift off layer as described herein and a 193 nm laser for lifting off the substrate from the device structure.

After lift-off the remaining structure may be dipped in an acid such as hydrochloric acid, phosphoric acid or sulphuric acid with, or without water to remove unwanted metallic droplets from the laser irradiation.

After liftoff the substrate may be dipped in a caustic solution such as potassium hydroxide, ammonium hydroxide, hydrogen peroxide or the like with, or without, water to remove unwanted metallic droplets from the laser irradiation.

Figure 17:
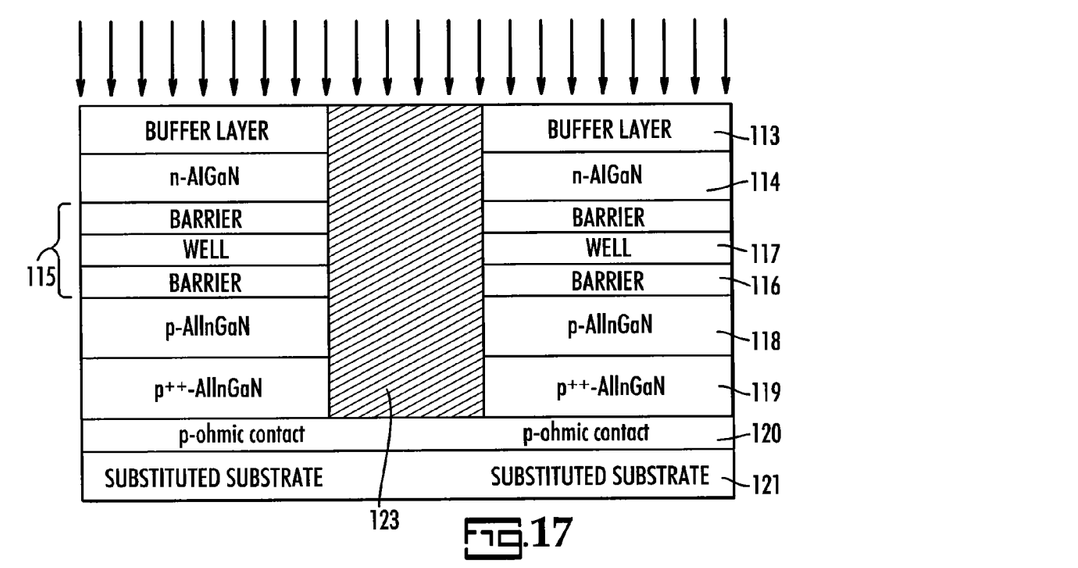
FIG. 17 shows material removal to access the second conductive layer.

Referring to FIG. 17, the remaining buffer from layer 113, will be ideally etched by inductively coupled plasma etching and reactive ion etching in suitable chemical ambient such as a mixture of boron-trichloride, chlorine and argon gases. In some embodiments, the etching will be performed only by reactive ion etching and may not involve the ICP power source but is not limited thereto. In some embodiment, the reactive etching will consist only of boron-trichloride and argon with specifically chlorine gas turned-OFF to improve the surface conditions of the finished n-type contact layer. In another embodiment, the remaining buffer is removed via either wet chemical etching, photoelectrical chemical wet etching, or lap and polish techniques that are well known to those skilled in the art.

Figure 18:
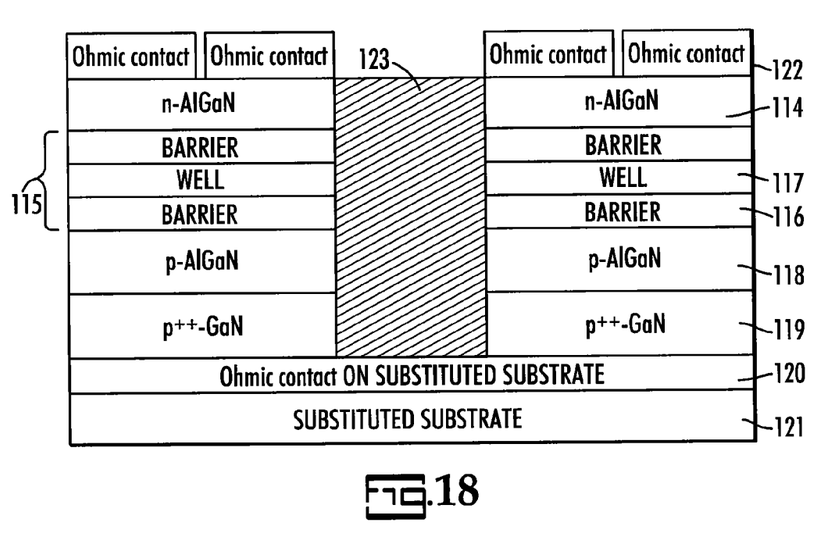
FIG. 18 shows the vertically conducting device with contacts on opposite sides of the epilayers.

Referring to FIG. 18, an ohmic contact, 122, may be provided on the contact layer, 114. The contacts may be a titanium contact. Other materials may be used for the ohmic contact. For example, the ohmic contact may comprise rhodium, aluminum, vanadium, vanadium nitride, titanium nitride, tantalum, tantalum nitride gold and/or any combination of the above mentioned metals. The ohmic contact may be followed up by a stack of metal layers such as titanium/gold, electroplated thick gold needed for external wire-bonding and flip-chip packaging. In some embodiments, the ohmic contact and the subsequent metal stack combined together has an average thickness of less than 10 μm. In some embodiments, the combined metal stack has a combined thickness ranging from 500 Å to 10 μm.

The ohmic contact may be formed by electron beam (e-beam) evaporation or any other suitable techniques for controllably forming atomically thin metallic films. For example, it may be possible to form the ohmic contacts by electroplating, or thermal evaporation provided adequate process control is maintained. The geometrical configuration of the contact is designed such that there are areas of the n-type layer that are not in intimate contact with the contact metal to enhance the extraction of light from the device. This configuration is designed to maximize light extraction, while simultaneously minimizing input resistance.

Again referring to FIG. 18, the contact to layer, 114, has partial opening to allow the UV light to escape from the semiconductor for efficient light extraction.

Referring to FIG. 18, The nitrogen face epilayer (layer 114) on the top side is susceptible to chemical etching with acids and bases such as hydrocholoric acid, sulphuric acid, phosphoric acid, ammonium hydroxide, potassium hydroxide, hydrogen peroxide or any combination thereof such that the surface may be etched by hydrochloric acid followed by dipping in ammonium hydroxide or a similar combination. This treatment makes the surface rough thereby allowing more light to be scattered and hence improves the efficiency of the devices.

Figure 19:
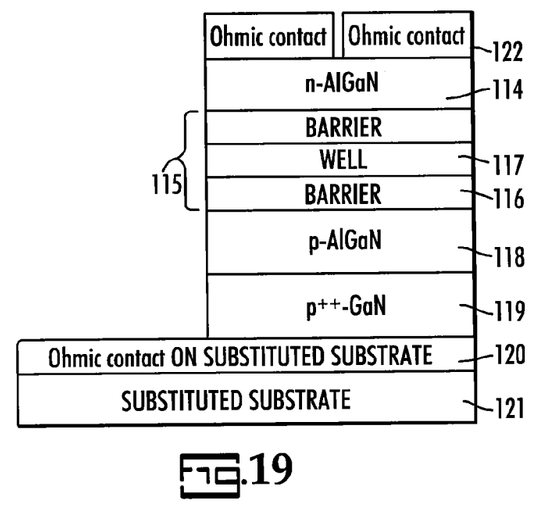
FIG. 19 schematically illustrates a vertically conducting light emitting device.

A completed vertical ultra-violet light emitting device with peak emission wavelength of less than 365 nm is illustrated in FIG. 19. In FIG. 19 the device, generally comprises layers 114-119 as described above which remain after the substrate is removed. A substitute substrate, 121, is applied, preferably on the p-type semiconductor side. Ohmic contacts, 120 and 122 are applied to provide connectivity.

The device may further comprise an epoxy dome to enhance light output. The preferred polymers are a mixture of silicone elastomers. The right composition of such materials are formed by mixing a two part adhesive namely part A (base) and part B (curing agent) in correct proportions. The proportional ratio varies depending upon emission wavelength of devices. Typical examples are 4:2, 6:1, 8:1, 10:1, 5:5, 2:6, 7:3 but is not limited thereto. Other silicone polymer can also be used. The adhesive is formed into a dome shape, and thermally cured between 50° C.-300° C. in atmospheres such as oxygen, air, nitrogen, vacuum or argon for proper transparency and form. The domes are carefully attached by providing a droplet of the same polymer over the die. The droplet of polymer migrates towards the entire chip due to surface tension and once the dome is placed over the die the polymer cures thereby securing the dome to the light emitting diode package.

In one embodiment, the buffer layer includes at least one strain layer superlattice consisting of alternating layers of $Al_xIn_yGa_{1-x-y}N/Al_rIn_sGa_{1-r-s}N$ such that $0<x\le1$, $0\le y\le1$, $0<x+y\le1$, $0<r\le1$, $0\le s\le1$, and $0<r+s\le1$ and the bandgap of the two materials are not the same. In a preferred embodiment, the materials are deposited via PALE deposition, although this is not necessary for the present invention. The superlattice layers function as dislocation filters wherein defect bending results in a decrease in the magnitude of defects that extend to the subsequent light emitting region.

In one embodiment, the buffer layer comprises a series of layers and laterally overgrown layers that are formed through a combination of PALE growth, conventional growth, and pulsed lateral overgrowth (PLOG).

Pulsed lateral overgrowth (PLOG) is a technique wherein a Group III comprising material such as triethyl gallium, or an trialkly aluminum and a nitrogen material such as ammonia, are supplied in a vapor phase for deposition of the Group III nitride. With pulsed lateral overgrowth the flow rate of the Group III material is maintained at a constant rate whereas the flow rate of the nitrogen compound is systematically altered, preferable from full flow to off, in a predetermined sequence as set forth in "Vertically Faceted Lateral Overgrowth of GaN on SiC with Conducting Buffer Layers Using Pulsed Metalorganic Chemical Vapor Deposition", Fareed et al., *Applied Physics Letters*, Vol. 77, Number 15, 9 Oct. 2000, page 2343-5 which is incorporate herein by reference. By controlling the flow rate, and therefore chemical availability, of the nitrogen systematic growth of select crystallographic planes can be accomplished. The systematic growth provides a layer which significantly mitigates transfer of dislocations caused by lattice mismatches through the layer.

The pulsed atomic layer epitaxy (PALE) approach allows accurate control of the quaternary layer composition and thickness by simply changing the number of aluminum, indium, boron and gallium pulses in a unit cell and the number of unit cell repeats. (J. Zhang et al., Applied Physics Letters, Vol. 79, No. 7, pp. 925-927, 13 Aug. 2001, J. P. Zhang et al. Applied Physics Letters, Vol. 81, No. 23, pp. 4392-4394, 2 Dec. 2002). By controlling the pulse time, pulse condition, flow rate, and therefore chemical availability, the systematic growth provides a layer which significantly controls the composition, thickness and crystalline quality.

Pulsed metalorganic chemical vapor deposition provides metalorganic materials and ammonia wherein one, or both, of the flows are intermittently terminated. The systematic pulsing of either the metalorganic or the nitrogen source provides a fast transition between subsequent layers and well ordered interfaces.

Each of the $Al_aGa_{1-a}N$ layer, GaN layer, $In_{1-b}Ga_bN/GaN$, $Al_cIn_dGa_{1-c-d}N$ and $Al_fIn_gGa_{1-f-g}N$ buffer layers can be formed by at least one technique selected from metalorganic chemical vapor deposition, hydride vapor phase epitaxy, pulsed atomic layer epitaxy, rapid pulsed lateral overgrowth epitaxy, metalorganic hydride vapor phase epitaxy, molecular beam epitaxy or flow modulation technique and similar methods.

The precursors for the layers are organometallics and preferably the methyl derivative such as trimethylaluminum, trimethylgallium, trimethylboron and trimethylindium. Larger molecular weight organometallics can be used but the trimethylmetallic is most preferred due to the molecular weight.

The semiconductor active layers can be grown by pulsing the concentration of precursors such as trialkyl (ethyl or methyl but preferably methyl) aluminum, indium, boron or gallium, or ammonia. Pulsing of precursor concentration assists in atomic layer surface migration of materials which improves the material properties of the layer. This growth technique has been referred to in several forms in the prior art and also incorporated in this patent as a PALE growth technique.

The light emitting device may be mounted by a flip-chip technique. The devices are mounted with the active epilayer side facing the carrier, also referred to as a sub-mount, by various bonding techniques known in the art including but not limited to, bump-bonding, thermosonic bonding, eutectic bonding or epoxy bonding wherein a suitable material is deposited at specific places on both the die and carrier. Specific preferred bonding materials include, but are not limited to, mixtures, preferably eutectic mixtures of tin, gold, lead and indium; silver paint and the like. Bonding materials are preferably deposited by thermal evaporation for thickness control but can be deposited by other techniques such as by electroplating, sputtering, etc.

The ohmic contact may be formed by electron beam (e-beam) evaporation or any other suitable techniques for controllably forming atomically thin metallic films. For example, it may be possible to form the ohmic contacts by electroplating, or thermal evaporation provided adequate process control is maintained. The geometrical configuration of the contact is designed such that there are areas of the n-type layer that are not in intimate contact with the contact metal to enhance the extraction of light from the device. This configuration is designed to maximize light extraction, while simultaneously minimizing input resistance.

The LED is described with a forward bias without limitation thereto. Reverse bias device could be manufactured in the same fashion wherein the anode and cathodes are reversed.

Pulsed metalorganic chemical vapor deposition allows for a temporal separation of metallorganic and nitrogen source. By introducing the group III and group V precursors in an alternating sequence growth efficiency is maximized and parasitic reactions are minimized.

The present invention is described with reference to the preferred embodiments without limitation thereto. One of skill in the art would realize additional limitations and embodiments which are within the scope of the invention but which are not specifically enumerated.

The invention claimed is:

1. A vertically conducting LED comprising in a layered arrangement:
   a metal p-contact;
   a highly thermally conductive submount on said metal p-contact, wherein said highly conductive submount has a thermal conductivity of at least 100 W/m°K;
   a p-type layer on said thermally conductive submount, said p-type layer comprising $Al_{1-x-y}In_yGa_xN$ wherein $0 \leq x \leq 1$ and $0 \leq y \leq 1$;
   a quantum well layer on said p-type layer, said quantum well layer comprising $Al_{1-x-y}In_yGa_xN$ wherein $0 \leq x \leq 1$ and $0 \leq y \leq 1$;
   an n-type layer on said quantum well layer, said n-type layer comprising $Al_{1-x-y}In_yGa_xN$ wherein $0 \leq x \leq 1$ and $0 \leq y \leq 1$;
   a metal n-contact in electrical contact on said n-type layer; and
   an n-type contact layer on said metal n-contact;
   wherein said vertically conducting LED has a peak emission at 200-365 nm.

2. The vertically conducting LED of claim 1 wherein said highly thermally conductive submount has a thermal conductivity of at least 500 W/m°K.

3. The vertically conducting LED of claim 2 wherein said highly thermally conductive submount has a thermal conductivity of at least 800 W/m°K.

4. The vertically conducting LED of claim 3 wherein said highly thermally conductive submount has a thermal conductivity of at least 1000 W/m°K.

5. The vertically conducting LED of claim 1 wherein said highly thermally conductive submount is selected from the group consisting of diamond, boron nitride, copper-tungsten alloy, copper-molybdenum alloy, metallic-ceramic composite structures, silicon carbide, alumina and aluminum nitride.

6. The vertically conducting LED of claim 1 wherein said layered arrangement further comprises an ohmic contact layer between said p-type layer and said highly thermally conductive submount.

7. The vertically conducting LED of claim 6 wherein said ohmic contact layer comprises a material selected from the group consisting of platinum, rhodium, zinc oxide, palladium, palladium oxide, titanium, nickel, gold, nickel/gold alloy, nickel oxide, nickel oxide/gold alloy, nickel oxide/platinum alloy, indium, tin, tin oxide, titanium/gold alloy and gold/tin alloy.

8. The vertically conducting LED of claim 6 wherein said ohmic contact layer has a thickness of 10 Å to 10 μm.

9. The vertically conducting LED of claim 8 wherein said ohmic contact layer has a thickness of 50 Å to 0.5 μm.

10. The vertically conducting LED of claim 1 wherein said n-type contact layer comprises a material selected from the group consisting of platinum, rhodium, zinc oxide, palladium, palladium oxide, titanium, nickel, gold, nickel/gold alloy, nickel oxide, nickel oxide/gold alloy, nickel oxide/platinum alloy, indium, tin, tin oxide, titanium/gold alloy and gold/tin alloy.

11. The vertically conducting LED of claim 1 wherein said n-type contact layer has a thickness of 10 Å to 1 μm.

12. The vertically conducting LED of claim 11 wherein said n-type contact layer has a thickness of 50 Å to 0.5 μm.

13. The vertically conducting LED of claim 1 wherein said n-type layer is silicon doped.

14. The vertically conducting LED of claim 1 wherein said p-type layer is doped with at least one dopant selected from the group consisting of magnesium, zinc and beryllium.

15. The vertically conducting LED of claim 1 wherein said quantum well layer comprises a multiplicity of layers.

16. The vertically conducting LED of claim 15 wherein said quantum well layer comprises at least one barrier layer and at least one quantum well.

17. The vertically conducting LED of claim 16 wherein said barrier layer has a thickness of at least 5 Å to no more than 300 Å.

18. The vertically conducting LED of claim 16 wherein said quantum well has a thickness of at least 5 Å to no more than 300 Å.

19. The vertically conducting LED of claim 7 wherein said quantum well layer comprises multiple barrier layers and multiple quantum wells in alternative arrangement.

20. The vertically conducting LED of claim 15 wherein said quantum well layer comprises no more than twelve quantum wells.

21. The vertically conducting LED of claim 1 wherein at least one layer selected from said p-type layer, said quantum well layer and said n-type layer comprises $Al_{1-x-y-z}In_yGa_xB_zN$ wherein $0 \leq x \leq 1$, $0 \leq y \leq 1$ and $0 \leq z \leq 1$.

22. An LED comprising in a layered arrangement:
   a metal p-contact;
   a highly thermally conductive submount attached to said metal p-contact, wherein said highly conductive submount has a thermal conductivity of at least 100 W/m°K;
   a p-type layer on said thermally conductive submount, said p-type layer comprising $Al_{1-x-y}In_yGa_xN$ wherein $0 \leq x \leq 1$ and $0 \leq y \leq 1$;
   a quantum well layer on said p-type layer, said quantum well layer comprising $Al_{1-x-y}In_yGa_xN$ wherein $0 \leq x \leq 1$ and $0 \leq y \leq 1$;
   an n-type layer on said quantum well layer, said n-type layer comprising $Al_{1-x-y}In_yGa_xN$ wherein $0 \leq x \leq 1$ and $0 \leq y \leq 1$; and
   an n-type contact layer on said metal n-contact; and
   wherein said LED has a peak emission at 200-365 nm.

23. The LED of claim 22 wherein said highly thermally conductive submount has a thermal conductivity of at least 1000 W/m°K.

24. The LED of claim 22 wherein said highly thermally conductive submount is selected from the group consisting of diamond, boron nitride, copper-tungsten alloy, copper-molybdenum alloy, metallic-ceramic composite structures, silicon carbide, alumina and aluminum nitride.

25. The LED of claim 22 wherein further comprising a p-contact layer in electrical contact with said highly thermally conductive submount.

26. The LED of claim 25 wherein said p-contact layer and said n-contact layer are coplanar.

27. The LED of claim 22 wherein said layered arrangement further comprises an ohmic contact layer between said p-type layer and said highly thermally conductive submount.

28. The LED of claim 27 wherein said ohmic contact layer comprises a material selected from the group consisting of platinum, rhodium, zinc oxide, palladium, palladium oxide, titanium, nickel, gold, nickel/gold alloy, nickel oxide, nickel oxide/gold alloy, nickel oxide/platinum alloy, indium, tin, tin oxide, titanium/gold alloy and gold/tin alloy.

29. The LED of claim 27 wherein said ohmic contact layer has a thickness of 10 Å to 10 μm.

30. The LED of claim 29 wherein said ohmic contact layer has a thickness of 50 Å to 0.5 μm.

31. The LED of claim 22 wherein said n-type contact layer comprises a material selected from the group consisting of platinum, rhodium, zinc oxide, palladium, palladium oxide, titanium, nickel, gold, nickel/gold alloy, nickel oxide, nickel oxide/gold alloy, nickel oxide/platinum alloy, indium, tin, tin oxide, titanium/gold alloy and gold/tin alloy.

32. The LED of claim 22 wherein said n-type contact layer has a thickness of 10 Å to 1 μm.

33. The LED of claim 32 wherein said n-type contact layer has a thickness of 50 Å to 0.5 μm.

34. The LED of claim 22 wherein said n-type layer is silicon doped.

35. The LED of claim 22 wherein said p-type layer is doped with at least one dopant selected from the group consisting of magnesium, zinc and beryllium.

36. The LED of claim 22 wherein said quantum well layer comprise a multiplicity of layers.

37. The LED of claim 36 wherein said quantum well layer comprises at least one barrier layer and at least one quantum well.

38. The LED of claim 37 wherein said barrier layer has a thickness of at least 5 Å to no more than 300 Å.

39. The LED of claim 37 wherein said quantum well has a thickness of at least 5 Å to no more than 300 Å.

40. The LED of claim 36 wherein said quantum well layer comprises multiple barrier layers and multiple quantum wells in alternative arrangement.

41. The LED of claim 36 wherein said quantum well layer comprises no more than twelve quantum wells.

42. The LED of claim 22 wherein at least one layer selected from said p-type layer, said quantum well layer and said n-type layer comprises $Al_{1-x-y-z}In_yGa_xB_zN$ wherein $0 \leq x 1$, $0 \leq y \leq 1$ and $0 \leq z \leq 1$.

* * * * *